(12) United States Patent
Zhou

(10) Patent No.: US 11,081,549 B2
(45) Date of Patent: Aug. 3, 2021

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/101,596

(22) Filed: Aug. 13, 2018

(65) Prior Publication Data

US 2019/0067419 A1 Feb. 28, 2019

(30) Foreign Application Priority Data

Aug. 23, 2017 (CN) .......................... 201710728257.2

(51) Int. Cl.
*H01L 29/10* (2006.01)
*H01L 21/8238* (2006.01)
(Continued)

(52) U.S. Cl.
CPC ...... *H01L 29/1083* (2013.01); *H01L 21/0334* (2013.01); *H01L 21/823807* (2013.01);
(Continued)

(58) Field of Classification Search
CPC ..... H01L 21/823821; H01L 21/823807; H01L 21/823431; H01L 21/823892;
(Continued)

(56) References Cited

U.S. PATENT DOCUMENTS

2013/0001591 A1* 1/2013 Wu ................. H01L 21/823821
257/77
2015/0187634 A1 7/2015 Chiang et al.
(Continued)

FOREIGN PATENT DOCUMENTS

CN 103531477 A 1/2014
CN 105448721 A 3/2016
(Continued)

*Primary Examiner* — Mohammed Shamsuzzaman
*Assistant Examiner* — Aaron J Gray
(74) *Attorney, Agent, or Firm* — Anova Law Group, PLLC

(57) ABSTRACT

A method for fabricating a semiconductor device includes providing a semiconductor structure including a semiconductor substrate, a plurality of semiconductor fin structures, and a trench insulation layer formed on the semiconductor substrate and surrounding each semiconductor fin structure. The semiconductor fin structures include a plurality of first semiconductor fin structures and a plurality of second semiconductor fin structures. The top surface of the trench insulation layer is leveled with the top surface of the semiconductor fin structures. The method includes performing a first anti-punch-through doping process on the first semiconductor fin structures to form a first anti-punch-through region in each first semiconductor fin structure, removing a portion of each second semiconductor fin structure to form a trench, and forming an epitaxial layer on the remaining portion of the second semiconductor fin structure and a second anti-punch-through region in the epitaxial layer or in the remaining second semiconductor fin structure.

10 Claims, 12 Drawing Sheets

(51) Int. Cl.
*H01L 21/033* (2006.01)
*H01L 27/092* (2006.01)
*H01L 29/78* (2006.01)
*H01L 21/762* (2006.01)
*H01L 21/84* (2006.01)
*H01L 27/12* (2006.01)

(52) U.S. Cl.
CPC .. *H01L 21/823821* (2013.01); *H01L 27/0924* (2013.01); *H01L 29/785* (2013.01); *H01L 21/76224* (2013.01); *H01L 21/823892* (2013.01); *H01L 21/845* (2013.01); *H01L 27/1211* (2013.01)

(58) Field of Classification Search
CPC ............. H01L 29/785; H01L 29/66795; H01L 29/1083; H01L 27/0924; H01L 27/1211
See application file for complete search history.

(56) References Cited

U.S. PATENT DOCUMENTS

| | | | |
|---|---|---|---|
| 2015/0380556 A1* | 12/2015 | Ching | H01L 29/66795 257/351 |
| 2016/0104776 A1* | 4/2016 | Ching | H01L 29/66545 257/401 |
| 2016/0181244 A1* | 6/2016 | Peng | H01L 21/823821 257/345 |
| 2016/0218104 A1* | 7/2016 | Wen | H01L 21/823821 |
| 2018/0240713 A1* | 8/2018 | Bi | H01L 21/823821 |

FOREIGN PATENT DOCUMENTS

| | | |
|---|---|---|
| CN | 106206729 A | 12/2016 |
| CN | 107017252 A | 8/2017 |
| CN | 107026083 A | 8/2017 |

* cited by examiner

```
┌─────────────────────────────────────────────────────────────────────┐
│  Providing a semiconductor structure including a substrate, a plurality of │
│ semiconductor fin structures formed on the substrate, and a trench insulation │
│     layer formed on the semiconductor substrate and surrounding each  │
│   semiconductor fin structure, the plurality of semiconductor fin structures │ ～ S201
│   including a plurality of first semiconductor fin structures and a plurality of │
│    second semiconductor fin structures, and the top surface of the trench │
│     insulation layer leveled with the top surface of the semiconductor fin │
│                              structures                             │
└─────────────────────────────────────────────────────────────────────┘
                                    │
                                    ▼
┌─────────────────────────────────────────────────────────────────────┐
│ Performing a first anti-punch-through doping process on the plurality of first │
│   semiconductor fin structures to form a first anti-punch-through region in │ ～ S202
│                  each first semiconductor fin structure             │
└─────────────────────────────────────────────────────────────────────┘
                                    │
                                    ▼
┌─────────────────────────────────────────────────────────────────────┐
│  Removing a portion of each second semiconductor fin structure to form a │ ～ S203
│     trench after performing the first anti-punch-through doping process │
└─────────────────────────────────────────────────────────────────────┘
                                    │
                                    ▼
┌─────────────────────────────────────────────────────────────────────┐
│  Forming an epitaxial layer containing a second anti-punch-through region │
│  on the remaining portion of the second semiconductor fin structure in each │ ～ S204
│                                trench                               │
└─────────────────────────────────────────────────────────────────────┘
```

FIG. 2

```
┌─────────────────────────────────────────────────────────────────┐
│ Providing a semiconductor structure including a substrate, a    │
│ plurality of semiconductor fin structures formed on the         │
│ substrate, and a trench insulation layer formed on the          │
│ semiconductor substrate and surrounding each semiconductor fin  │──── S1501
│ structure, the plurality of semiconductor fin structures        │
│ including a plurality of first semiconductor fin structures and │
│ a plurality of second semiconductor fin structures, and the top │
│ surface of the trench insulation layer leveled with the top     │
│ surface of the semiconductor fin structures                     │
└─────────────────────────────────────────────────────────────────┘
                                  │
                                  ▼
┌─────────────────────────────────────────────────────────────────┐
│ Performing a first anti-punch-through doping process on the     │
│ plurality of first semiconductor fin structures to form a first │──── S1502
│ anti-punch-through region in each first semiconductor fin       │
│ structure                                                       │
└─────────────────────────────────────────────────────────────────┘
                                  │
                                  ▼
┌─────────────────────────────────────────────────────────────────┐
│ Removing a portion of each second semiconductor fin structure   │
│ to form a trench after performing the first anti-punch-through  │──── S1503
│ doping process                                                  │
└─────────────────────────────────────────────────────────────────┘
                                  │
                                  ▼
┌─────────────────────────────────────────────────────────────────┐
│ Performing a second anti-punch-through doping process to form   │
│ a second anti-punch-through region in the remaining portion of  │──── S1504
│ each second semiconductor fin structure                         │
└─────────────────────────────────────────────────────────────────┘
                                  │
                                  ▼
┌─────────────────────────────────────────────────────────────────┐
│ Forming an epitaxial channel layer on the remaining portion of  │──── S1505
│ the second semiconductor fin structure in each trench           │
└─────────────────────────────────────────────────────────────────┘
```

FIG. 15

SEMICONDUCTOR DEVICES AND FABRICATION METHODS THEREOF

CROSS-REFERENCES TO RELATED APPLICATIONS

This application claims the priority of Chinese Patent Application No. CN201710728257.2, filed on Aug. 23, 2017, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

As the dimension of metal-oxide semiconductor field-effect transistor (MOSFET) device is gradually reduced, the short channel effect (SCE) becomes a key issue. Fin field effect transistor (Fin-FET) device demonstrates desired gate-control ability in controlling charges in the channel, and thus the size of complementary metal oxide semiconductor (CMOS) device may be further reduced.

Currently, in order to prevent punch through between the source and the drain in Fin-FET devices, it is required to perform an anti-punch-through implantation (also known as channel-stop implantation) process on the semiconductor fin structures to form an anti-punch-through region in the semiconductor fin structures. The anti-punch-through implantation process may affect the performance of the Fin-FET devices, and thus controls of the process are very important for fabricating Fin-FET devices.

In addition, the performance of conventionally-formed Fin-FET devices still needs to be improved. The disclosed semiconductor devices and fabrication methods thereof are directed to solve one or more problems set forth above and other problems in the art.

BRIEF SUMMARY OF THE DISCLOSURE

One aspect of the present disclosure includes a method for fabrication semiconductor structures. The method includes providing a semiconductor structure including a semiconductor substrate, a plurality of semiconductor fin structures formed on the semiconductor substrate, and a trench insulation layer formed on the semiconductor substrate and surrounding each semiconductor fin structure. The plurality of semiconductor fin structures include a plurality of first semiconductor fin structures and a plurality of second semiconductor fin structures. The top surface of the trench insulation layer is leveled with the top surface of the semiconductor fin structures. The method also includes performing a first anti-punch-through doping process on the plurality of first semiconductor fin structures to form a first anti-punch-through region in each first semiconductor fin structure, removing a portion of each second semiconductor fin structure to form a trench, and forming an epitaxial layer on the remaining portion of the second semiconductor fin structure in each trench and a second anti-punch-through region in one of the epitaxial layer and the remaining portion of the second semiconductor fin structure.

Another aspect of the present disclosure provides a semiconductor device. The semiconductor device includes a semiconductor substrate, and a plurality of semiconductor fin structures formed on the semiconductor substrate and including a plurality of first semiconductor fin structures and a plurality of second semiconductor fin structures separated from the plurality of first semiconductor fin structures. The plurality of second semiconductor fin structures have a top surface lower than the plurality of first semiconductor fin structures, and a first anti-punch-through region is formed in each first semiconductor fin structure. The semiconductor device further includes a trench insulation layer formed on the semiconductor substrate and surrounding each semiconductor fin structure, and an epitaxial layer formed on the second semiconductor fin structures. A second anti-punch-through region is formed in one of the epitaxial layer and the second semiconductor fin structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 2 illustrates a flowchart of an exemplary method for fabricating a semiconductor device consistent with various embodiments of the present disclosure;

FIG. 15 illustrates a flowchart of another exemplary method for fabricating a semiconductor device consistent with various embodiments of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
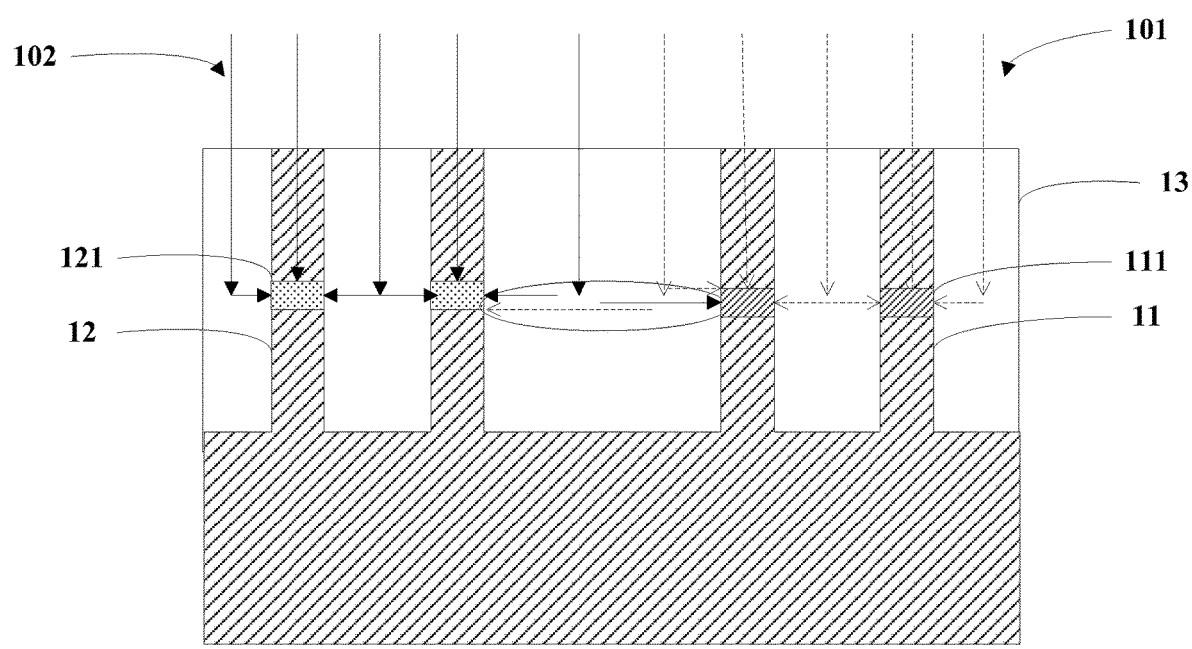
FIG. 1 illustrates a schematic cross-section view of a semiconductor structure at a certain stage during a process for forming an anti-punch-through region in semiconductor fin structures.

FIG. 1 shows a schematic cross-section view of a semiconductor structure at a certain stage during a process for forming an anti-punch-through region in the semiconductor fin structures. Referring to FIG. 1, the semiconductor structure includes a plurality of first semiconductor fin structures 11 used to form N-type metal-oxide-semiconductor (NMOS) devices and a plurality of second semiconductor fin structures 12 used to form P-type metal-oxide-semiconductor (PMOS) devices. In order to form NMOS devices, a first anti-punch-through implantation process 101 is performed on the plurality of first semiconductor fin structures 11. During the first anti-punch-through implantation process 101, boron ions are implanted into the first semiconductor fin structures 11 to form a first anti-punch-through region 111 in the first semiconductor fin structures 11 that are used to form NMOS devices in a subsequent process. In addition, in order to form PMOS devices, a second anti-punch-through implantation process 102 is performed on the plurality of second semiconductor fin structures 12. During the second anti-punch-through implantation process 102, arsenic or phosphorus ions are implanted into the second semiconductor fin structures 12 to form a second anti-punch-through region 121 in the second semiconductor fin structures 12 that are used to form PMOS devices in a subsequent process.

During this fabrication process, a portion of the boron ions in the first anti-punch-through implantation process 101 for forming NMOS devices may be implanted into a shallow trench isolation (STI) 13. Moreover, because the implantation depth of the first anti-punch-through implantation process 101 for forming NMOS devices is larger than the implantation depth for the second anti-punch-through implantation process 102 for forming PMOS devices, a portion of the boron ions implanted into the STI 13 may diffuse towards the second semiconductor fin structures 12. The diffusion of the boron ions from the STI 13 to the second semiconductor fin structures 12 is schematically shown in a circle in FIG. 1. After a subsequently-performed annealing process, the boron ions may diffuse and enter the second semiconductor fin structures 12 as dopants. Because the second semiconductor fin structures are used to form PMOS devices in a subsequent process, the performance of the formed semiconductor device may be degraded. For example, the diffusion and the doping of the boron ions to a second semiconductor fin structure 12 may cause changes in the threshold voltage $V_t$ and the saturation current $I_{dast}$ of the subsequently-formed PMOS device, resulting in a mismatch or a difference in the threshold voltage $V_t$ and/or the saturation current $I_{dast}$ between the PMOS device and neighboring devices. As such, the matching performance of the device may be affected.

Moreover, a portion of the implanted arsenic or phosphorus ions in the second anti-punch-through implantation process 102 for forming PMOS devices may diffuse into the first semiconductor fin structures 11. Although the diffusion of the arsenic or phosphorus ions may not be as prominent as the diffusion of boron ions, the diffusion of the arsenic or phosphorus ions may still be able to cause degradation of the performance of the formed semiconductor device.

The present disclosure provides a method for fabricating semiconductor devices. FIG. 2 illustrates a flowchart of an exemplary method for fabricating a semiconductor device consistent with various embodiments of the present disclosure. FIGS. 3-10, FIG. 11A, FIG. 11B, FIG. 11C, and FIGS. 12-14 illustrate schematic cross-section views of semiconductor structures at certain stages of the exemplary method for fabricating the semiconductor device.

Referring to FIG. 2, in Step S201, a semiconductor structure including a semiconductor substrate and a plurality of semiconductor fin structures formed on the semiconductor substrate may be provided. The semiconductor fin structures may include a plurality of first semiconductor fin structures and a plurality of second semiconductor fin structures. Further, a plurality of trenches separating the semiconductor fin structures may be filled with a trench insulation layer with the top surface of the trench insulation layer leveled with the top surface of the semiconductor fin structures.

Figure 3:
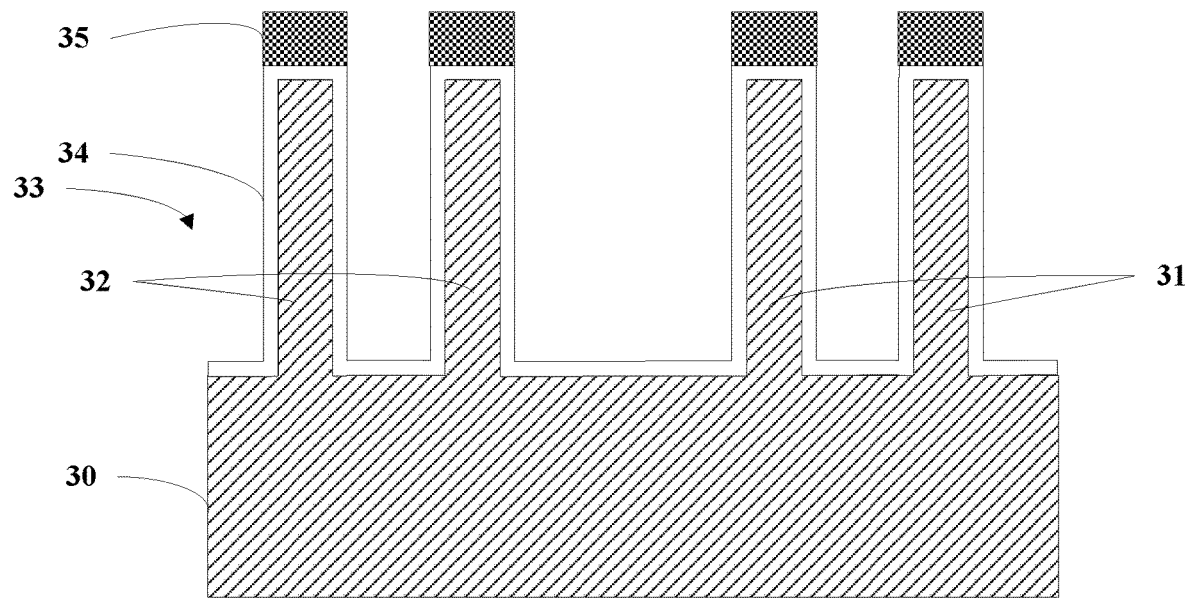
FIGS. 3-10, FIG. 11A, FIG. 11B, FIG. 11C, and FIGS. 12-14 illustrate schematic cross-section views of semiconductor structures at certain stages of an exemplary method for fabricating a semiconductor device consistent with various embodiments of the present disclosure.

FIG. 3 shows a schematic cross-section view of the provided semiconductor structure. Referring to FIG. 3, a semiconductor structure may be provided. The semiconductor structure may include a semiconductor substrate 30 and a plurality of semiconductor fin structures formed on the semiconductor substrate 30.

The semiconductor substrate 30 may be made of silicon, germanium, SiGe, GaAs, silicon on insulator (SOI), germanium on insulator (GOI), or any other appropriate semiconductor material or semiconductor structure. The plurality of semiconductor fin structures may be made of silicon, germanium, SiGe, GaAs, or any other appropriate semiconductor material. In one embodiment, the semiconductor substrate is made of silicon, and the plurality of semiconductor fin structures are also made of silicon.

The semiconductor fin structures formed on the semiconductor substrate 30 may include a plurality of first semiconductor fin structures 31 and a plurality of second semiconductor fin structures 32. The plurality of first semiconductor fin structures 31 and the plurality of second semiconductor fin structures 32 may be separated from each other. In one embodiment, the plurality of first semiconductor fin structure 31 may be used to form a plurality of first devices (e.g. NMOS devices), and the plurality of second semiconductor fin structures 32 may be used to form a plurality of second devices (e.g. PMOS devices).

In one embodiment, the semiconductor structure may also include a plurality of trenches 33 surrounding each semiconductor fin structure. Further, the semiconductor structure may include a liner insulation layer 34 formed on the semiconductor substrate 30 and the surface of the semiconductor fin structures. The liner insulation layer 34 may be made of a material including $SiO_2$. In addition, the semiconductor structure may also include a hard mask layer 35 covering the portion of the liner insulation layer 34 formed on the top surface of the semiconductor fin structures. The hard mask layer 35 may be made of a material including $SiN_x$.

Figure 4:
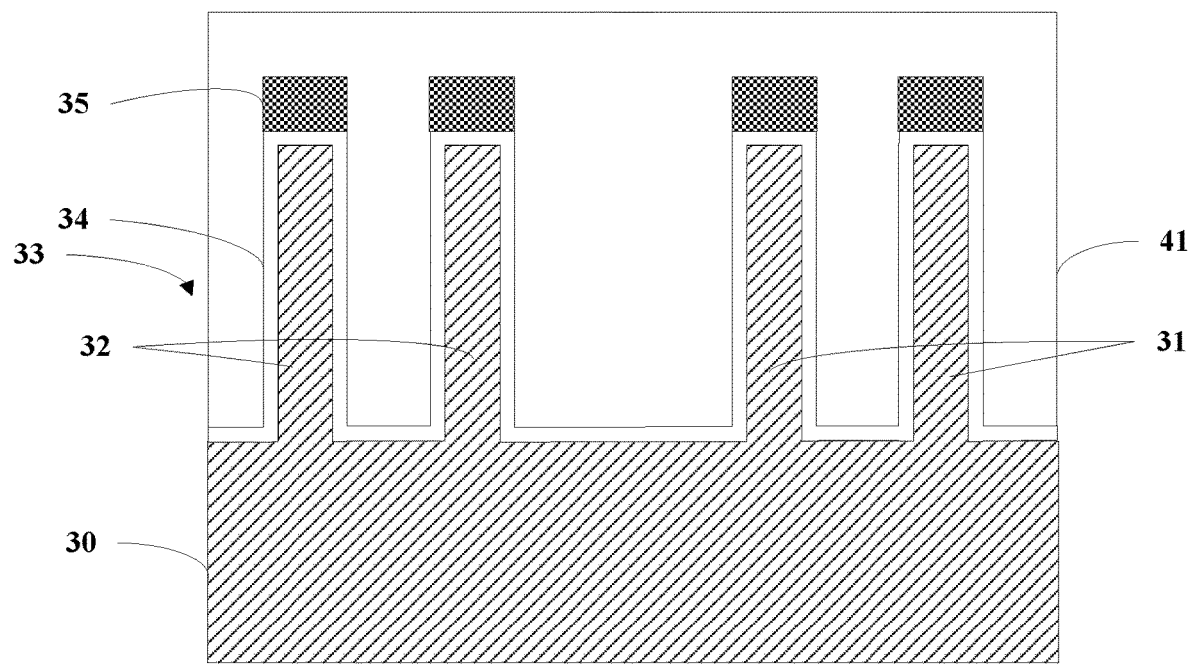

Further, referring to FIG. 4, a trench insulation layer 41 may be formed on the semiconductor structure (referring to FIG. 3). In one embodiment, the trench insulation layer 41 may be formed by a flowable chemical vapor deposition (FCVD) process. The trench insulation layer 41 may be made of a material including $SiO_2$.

Figure 5:
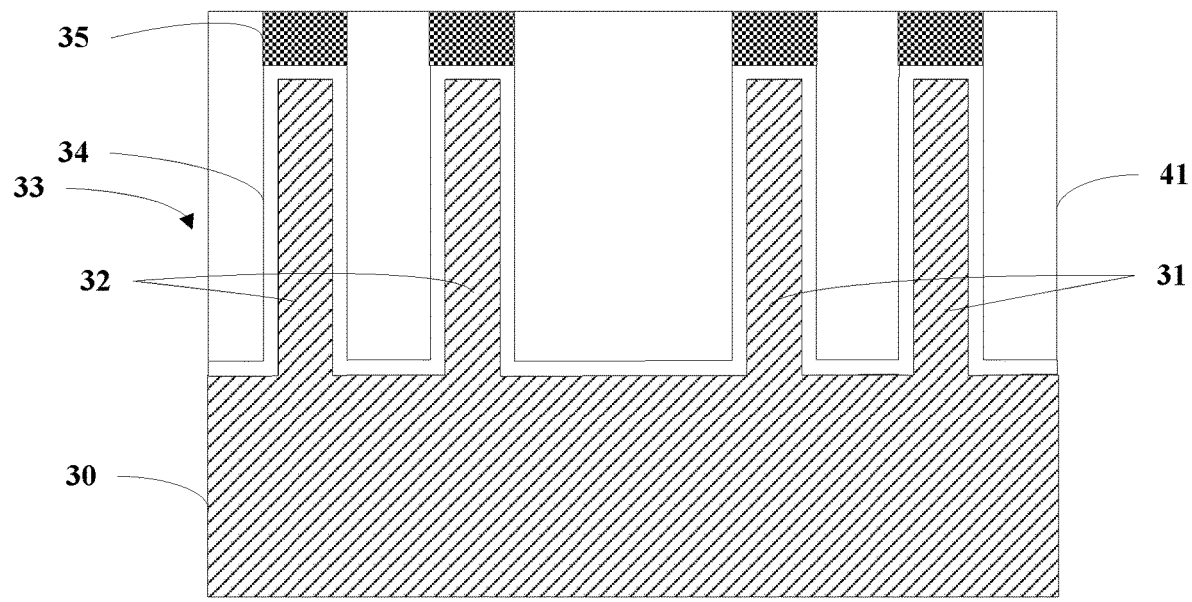

Further, referring to FIG. 5, a planarization process may be performed on the trench insulation layer 41 to expose the top surface of the hard mask layer 35. In one embodiment, the planarization process may be a chemical mechanical planarization (CMP) process.

Figure 6:
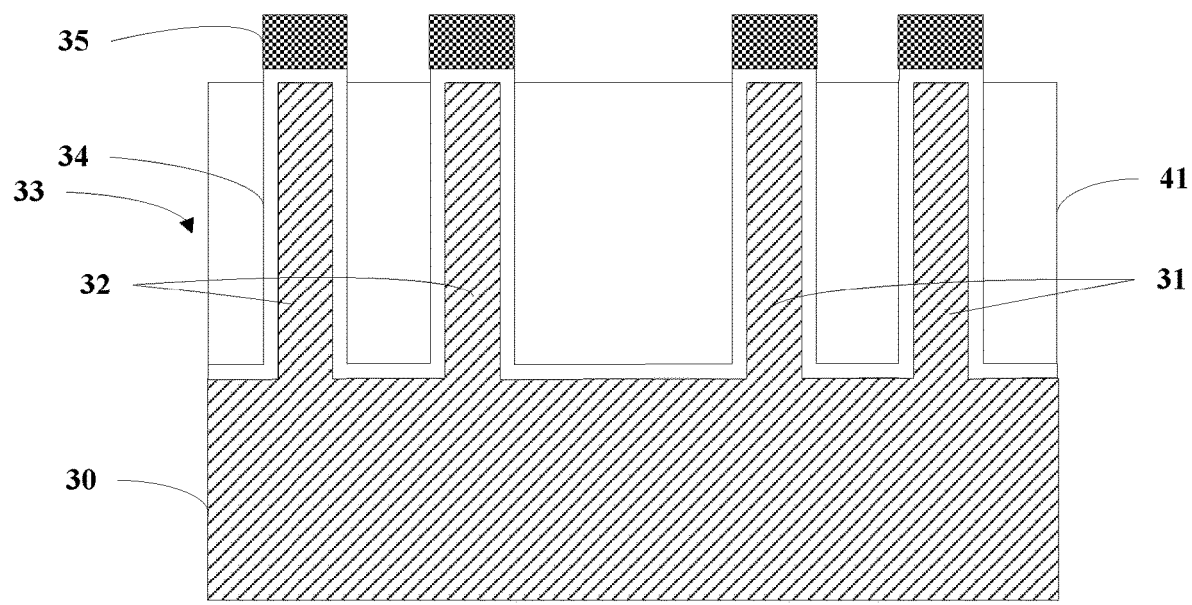

Further, referring to FIG. 6, an etching process may be performed to remove a portion of the trench insulation layer 41 such that the hard mask layer 35 may be completely exposed. That is, after the etching process, the top surface of the trench insulation layer 41 may be lower than the bottom surface of the hard mask layer 35. Therefore, the sidewall surfaces of the hard mask layer 35 may be exposed.

Figure 7:
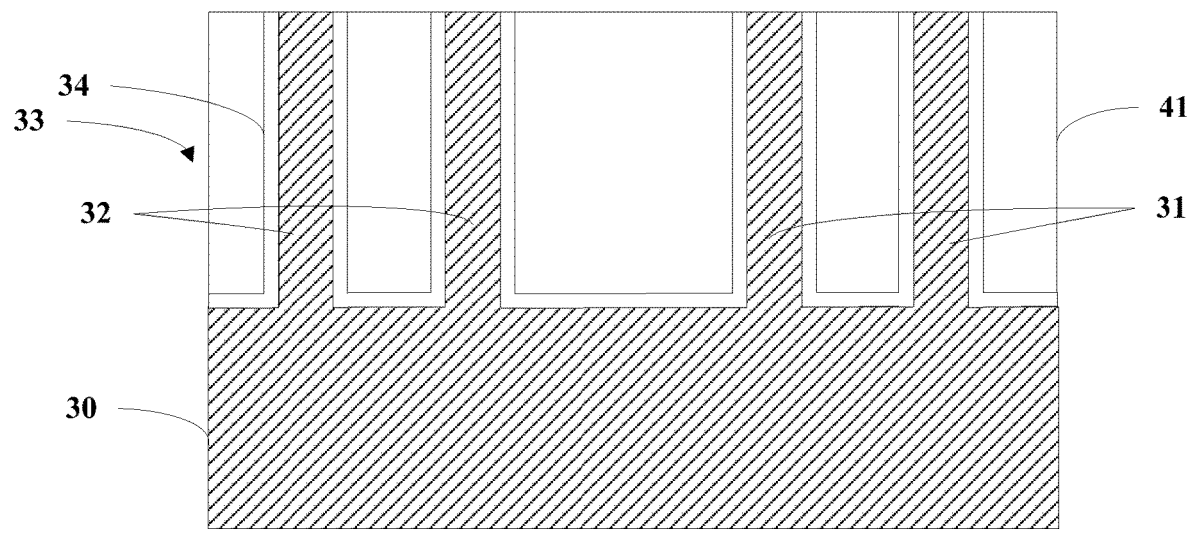

Further, referring to FIG. 7, the hard mask layer 35 may be removed. In one embodiment, during the process to remove the hard mask layer 35, the portion of the liner insulation layer 34 formed on the top surface of the plurality of semiconductor fin structures may also be removed. Therefore, the top surface of the plurality of semiconductor fin structures may be exposed.

FIG. 7 shows a semiconductor structure provided in Step S201 of FIG. 2. Referring to FIG. 7, the semiconductor structure may include a semiconductor substrate 30 and a plurality of semiconductor fin structures formed on the semiconductor substrate 30. The plurality of semiconductor fin structures may include a plurality of first semiconductor fin structures 31 and a plurality of second semiconductor fin structures 32. The plurality of first semiconductor fin structures 31 and the plurality of second semiconductor fin structures 32 may be separated from each other. The plurality of first semiconductor fin structures 31 may be used to form a plurality of first devices (e.g., NMOS devices) and the plurality of second semiconductor fin structures 32 may be used to form a plurality of second devices (e.g., PMOS devices).

Moreover, as shown in FIG. 7, the semiconductor structure may also include a plurality of trenches 33 surrounding each semiconductor fin structure and a trench insulation layer 41. In one embodiment, the top surface of the trench insulation layer 41 may be leveled with the top surface of the semiconductor fin structures. Further, the semiconductor structure may also include a liner insulation layer 34 formed on the semiconductor substrate and the semiconductor fin structures. Accordingly, the trench insulation layer 41 may be formed on the liner insulation layer 34.

Figure 8:
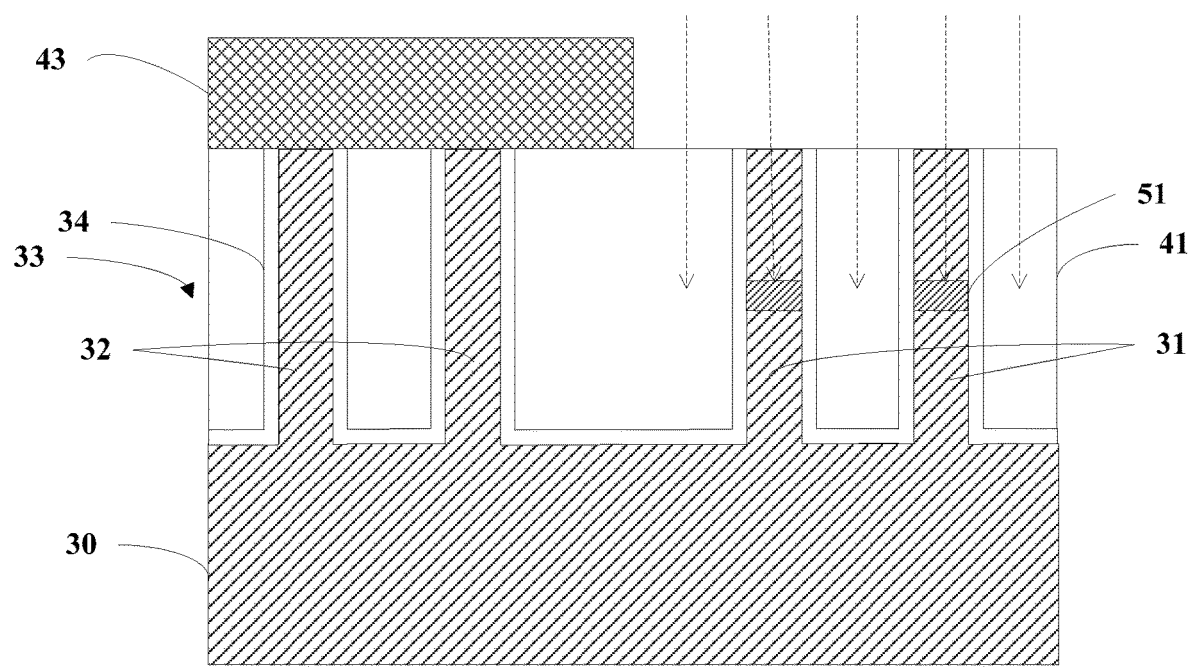

Returning to FIG. 2, in Step S202, a first anti-punch-through implantation process may be performed on the first semiconductor fin structures to form a first anti-punch-through region in the first semiconductor fin structures. FIG. 8 shows a schematic cross-section view of a corresponding semiconductor structure.

Referring to FIG. 8, after forming the semiconductor structure shown in FIG. 7, a first anti-punch-through doping process may be performed on the plurality of first semiconductor fin structures 31 to form a first anti-punch-through region 51 in the plurality of first semiconductor fin structures 31.

In one embodiment, as shown in FIG. 8, prior to performing the first anti-punch-through doping process, a patterned first mask layer 43 (e.g. a patterned photoresist layer) may be formed on the semiconductor structure shown in FIG. 7. The patterned first mask layer 43 may cover the plurality of second semiconductor fin structures 32 and expose the plurality of first semiconductor fin structures 31.

In one embodiment, the first anti-punch-through doping process may be a first ion implantation process. That is, after forming the patterned first mask layer, the first ion implantation process may be performed on the plurality of first semiconductor fin structures 31 in order to form the first anti-punch-through region 51 in the plurality of first semiconductor fin structures 31. Moreover, when the first semiconductor fin structures 31 are used to form a plurality of NMOS devices, the doping ions implanted in the first ion implantation process may include P-type dopants. For example, the P-type dopants may include boron ions or $BF_2$ ions. In addition, during the implantation of P-type dopants, the implantation energy of the first ion implantation process may be in a range of approximately 2 keV to 10 keV, and the implantation dose of the first ion implantation process may be in a range of approximately $1.0 \times 10^{13}$ atom/cm$^2$ to $4.0 \times 10^{14}$ atom/cm$^2$. For example, the implantation energy of the first ion implantation process may be 5 keV, 8 keV, or any energy between 2 keV and 10 keV, the implantation dose of the first ion implantation process may be $5.0 \times 10^{13}$ atom/cm$^2$, $1.0 \times 10^{14}$ atom/cm$^2$, or any dose between $1.0 \times 10^{13}$ atom/cm$^2$ and $4.0 \times 10^{14}$ atom/cm$^2$.

In one embodiment, the doping depth of the first anti-punch-through doping process (i.e., the implantation depth of the first ion implantation process) may be in a range of approximately 50 Å to 300 Å. The doping depth of the first anti-punch-through doping process refers to the depth of the doping ions implanted into the first semiconductor fin structures in the first anti-punch-through doping process. Therefore, the depth of the formed first anti-punch-through region 51 in the first semiconductor fin structure 31 may be a range of approximately 50 Å to 300 Å. For example, the depth of the formed first anti-punch-through region 51 in the first semiconductor fin structure 31 may be 100 Å or 200 Å.

Moreover, after performing the first anti-punch-through doping process to form the first anti-punch-through region 51, the fabrication method may also include removing the patterned first mask layer 43.

Figure 9:
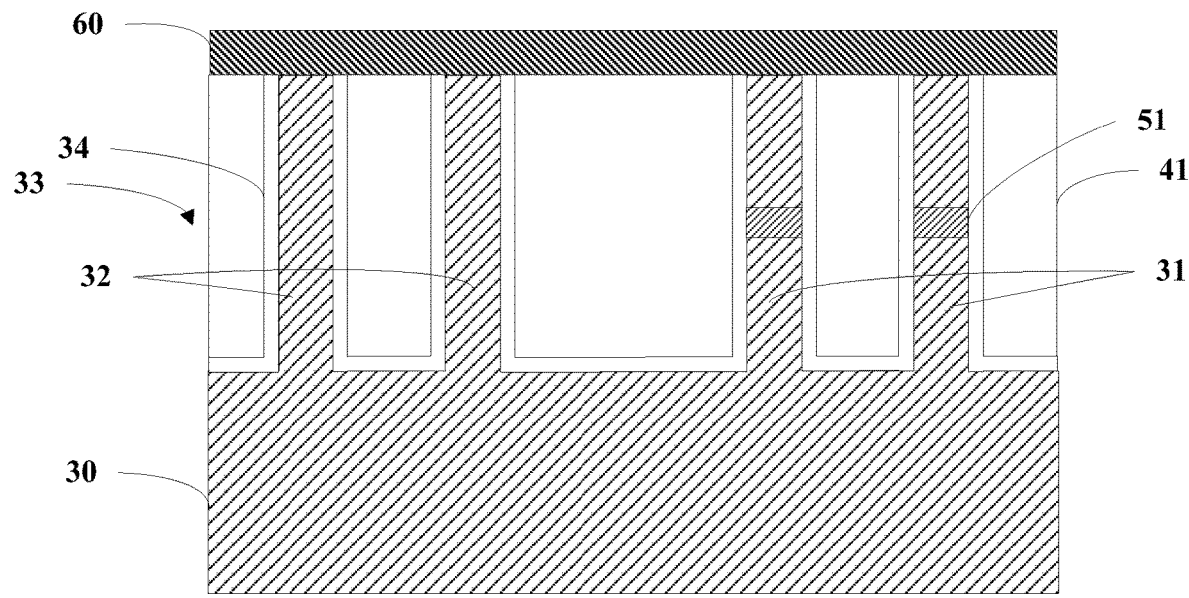
Figure 10:
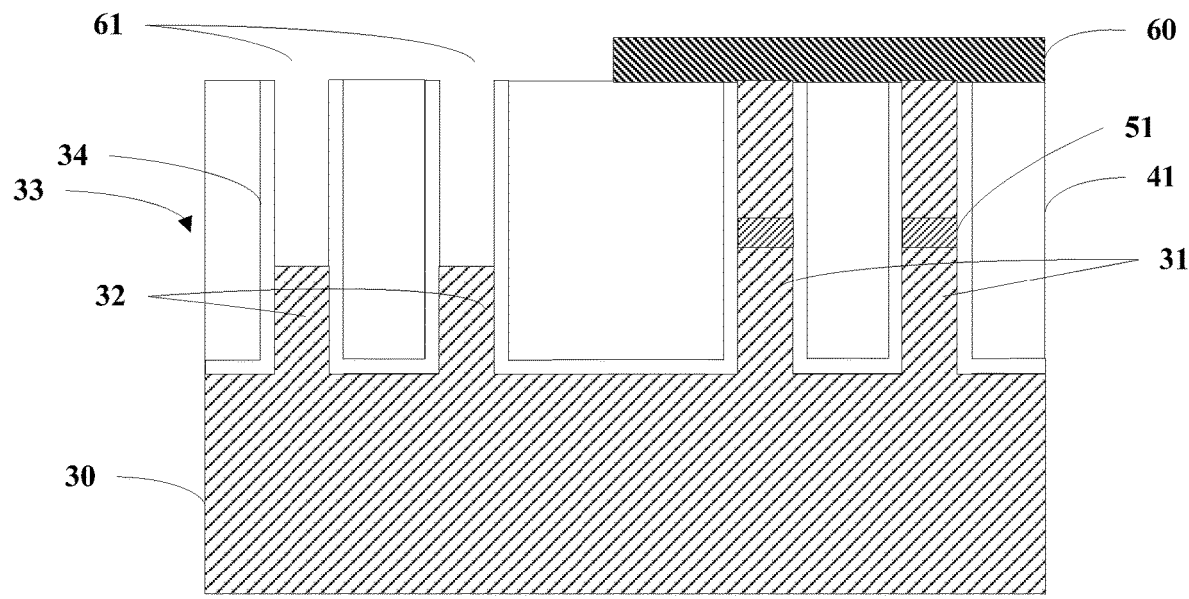

Further, returning to FIG. 2, in Step S203, a trench may be formed by removing a portion of each second semiconductor fin structure 32 through an etching process using a mask covering layer 60. FIGS. 9-10 illustrate schematic cross-section views of semiconductor structures at different stages of the process for forming the trench on each second semiconductor fin structures 32.

Referring to FIG. 9, after forming the first anti-punch-through region 51, a mask covering film may be formed on the semiconductor structure. For example, the mask covering film may be made of a material including $SiN_x$.

Further, referring to FIG. 10, the mask covering film may be patterned to form a mask covering layer 60. The mask covering layer 60 may cover the plurality of first semiconductor fin structures 31 and may expose the plurality of second semiconductor fin structures 32. Further, a portion of each second semiconductor fin structure 32 may be removed through an etching process using the mask covering layer 60 as an etch mask to form trenches 61.

In one embodiment, the depth of the trench 61 may be larger than the doping depth of the first anti-punch-through doping process. As such, the portion of each second semiconductor fin structure 32 accidentally doped by the P-type doping ions (e.g. boron ions or $BF_2$) due to the diffusion of the P-type doping ions may be substantially fully removed. In one embodiment, the depth of the trench 61 may be in a range of approximately 500 Å to 1000 Å. For example, the depth of the trench may be 700 Å or 850 Å.

Further, returning to FIG. 2, in Step S204, an epitaxial layer containing a second anti-punch-through region may be formed on the remaining portion of each second semiconductor fin structure. The epitaxial layer may include a semiconductor layer formed on the remaining portion of each second semiconductor fin structure and a channel layer formed on the semiconductor layer, and the second anti-punch-through region may be formed in the semiconductor layer.

Figure 11:
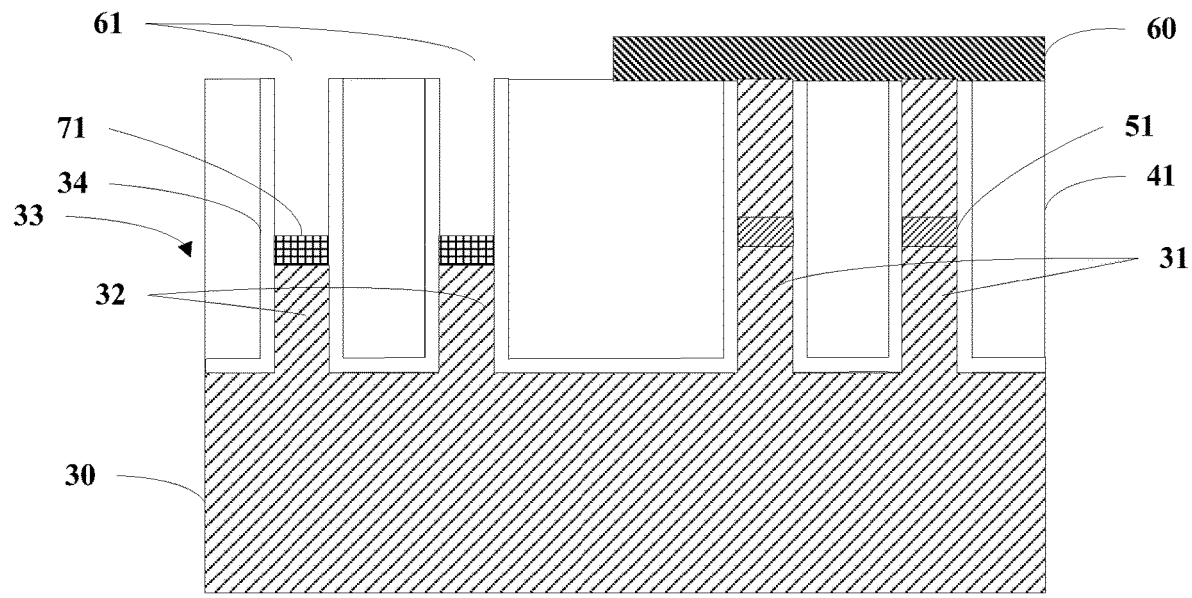
Figure 11B:
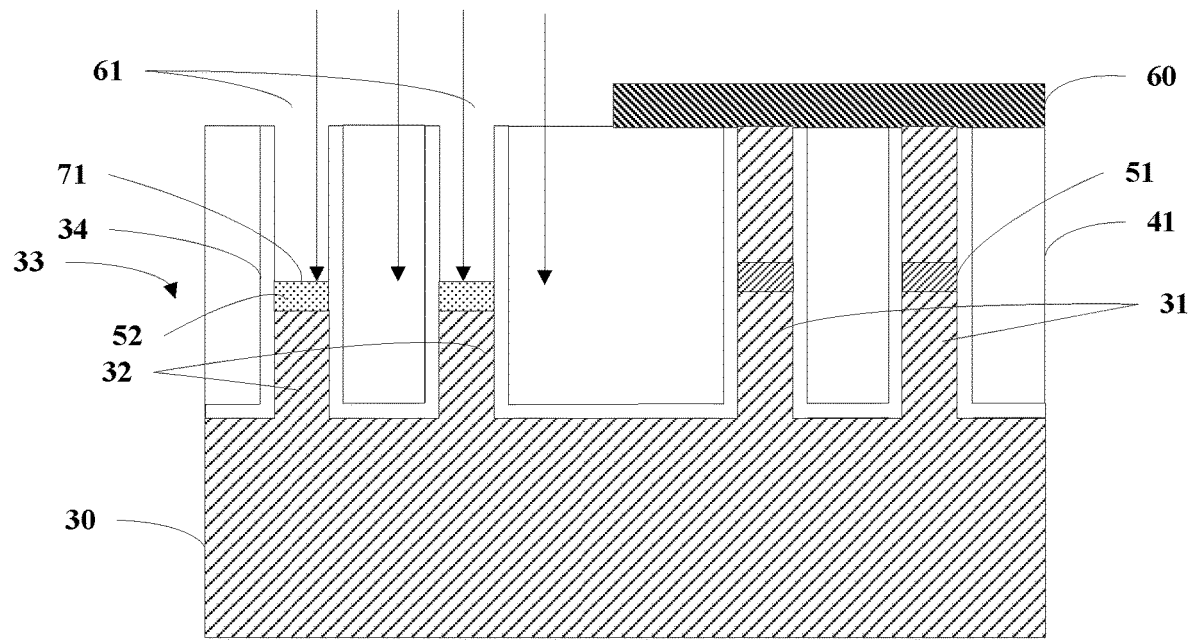

In one embodiment, forming the semiconductor layer containing the second anti-punch-through region on the remaining portion of each second semiconductor fin structure may include the following. For example, a semiconductor layer may be formed in each trench on the remaining portion of the second semiconductor fin structure. A second anti-punch-through doping process may be performed on the semiconductor layer to form the second anti-punch-through region in the semiconductor layer. FIG. 11A and FIG. 11B illustrate schematic views of the process for forming the semiconductor layer containing the second anti-punch-through region on the remaining portion of each second semiconductor fin structure.

Referring to FIG. 11A, a semiconductor layer 71 may be formed on the remaining portion of the second semiconductor fin structure 32 in each trench 61. The semiconductor layer 71 may be made of a material including silicon. In one embodiment, the thickness of the semiconductor layer 71 may be in a range of approximately 50 Å to 200 Å.

Further, referring to FIG. 11B, a second anti-punch-through doping process may be performed on the semiconductor layer 71 to form a second anti-punch-through region 52 in the semiconductor layer 71.

In one embodiment, the second anti-punch-through doping process may be a second ion implantation process. Moreover, when the second semiconductor fin structures 32 are used to form a plurality of PMOS devices, the doping ions implanted in the second ion implantation process may include N-type dopants. For example, the N-type dopants may include phosphorus ions or arsenic ions. In addition, during the implantation of N-type dopants, the implantation energy of the second ion implantation process may be in a range of approximately 10 keV to 50 keV, and the implantation dose of the second ion implantation process may be in a range of approximately $1.0 \times 10^{13}$ atom/cm$^2$ to $4.0 \times 10^{14}$ atom/cm$^2$. For example, the implantation energy of the second ion implantation process may be 20 keV, 40 keV, or any energy between 10 keV and 50 keV, the implantation dose of the second ion implantation process may be $5.0 \times 10^{13}$ atom/cm$^2$, $1.0 \times 10^{14}$ atom/cm$^2$, or any dose between $1.0 \times 10^{13}$ atom/cm$^2$ and $4.0 \times 10^{14}$ atom/cm$^2$.

In one embodiment, the doping depth of the second anti-punch-through doping process (i.e., the implantation depth of the second ion implantation process) may be in a range of approximately 50 Å to 300 Å. The doping depth of the second anti-punch-through doping process refers to the depth of the doping ions implanted into the semiconductor layer 71 in the second anti-punch-through doping process. Therefore, the depth of the formed second anti-punch-through region 52 in the semiconductor layer 71 may be in a range of approximately 50 Å to 300 Å. For example, the depth of the formed second anti-punch-through region 52 in the semiconductor layer 71 may be 100 Å or 200 Å.

In one embodiment, in addition to implanting the doping ions (e.g. N-type dopants) into the semiconductor layer 71 (referring to FIG. 11A), the second ion implantation process may also implant the doping ions into the remaining portion of each second semiconductor fin structure 32 located under a corresponding semiconductor layer 71. Therefore, a portion of the second anti-punch-through region 52 may also be formed in the remaining portion of each second semiconductor fin structure 32.

In one embodiment, after forming the semiconductor layer 71 and the second anti-punch-through region 52 in the semiconductor layer 71, an annealing process may be performed on the semiconductor structure. As such, the damage to the crystal lattice of the semiconductor layer during the second anti-punch-through doping process may be repaired. Therefore, the annealing process may be conducive to epitaxial growth of the channel layer in a subsequent process, and may also be able to activate the dopants in the second anti-punch-through region and, for example, also in the first anti-punch-through region.

Figure 11C:
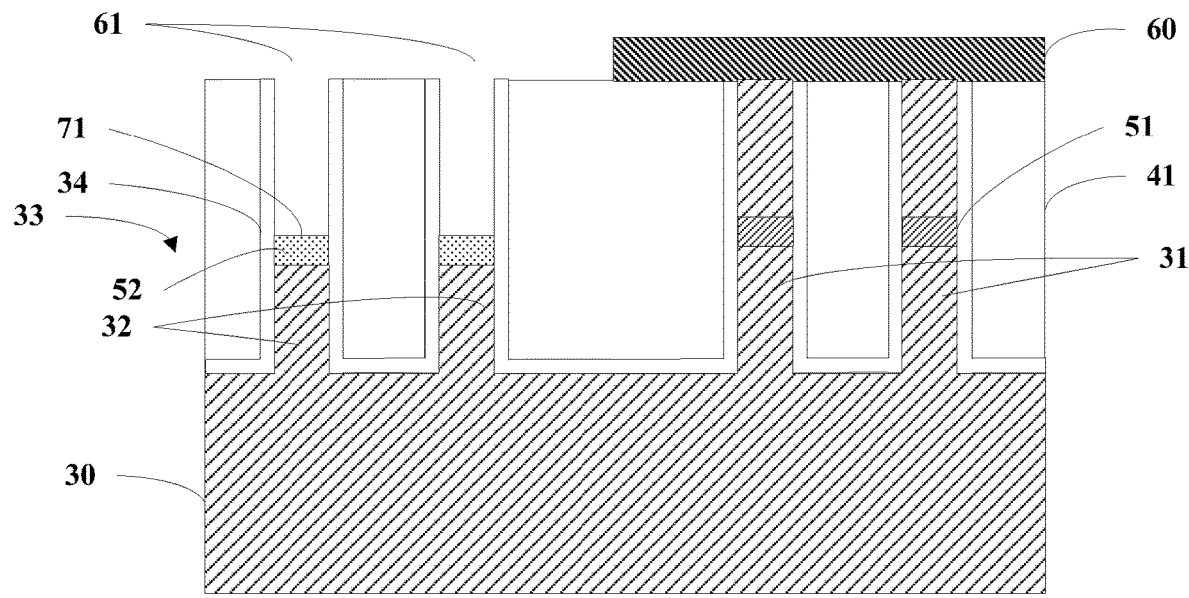

In another embodiment, the semiconductor layer containing the second anti-punch-through region may be formed by performing an in-situ doping process during the epitaxial growth of the semiconductor layer. FIG. 11C illustrates a schematic cross-section view of a corresponding semiconductor structure.

Referring to FIG. 11C, after forming the trench 61 by removing the top portion of each second semiconductor fin structure 32 (referring to FIG. 10), a semiconductor layer 71 may be epitaxially formed in each trench 61 on the remaining portion of the second semiconductor fin structure 32. Moreover, during the epitaxial growth of the semiconductor layer 71, an in-situ doping process may be performed to form the second anti-punch-through region 52.

In one embodiment, the in-situ doping process may be performed throughout the epitaxial growth of the semiconductor layer 71. That is, the second anti-punch-through region 52 may be simultaneously formed with the semiconductor layer 71. In other embodiments, the in-situ doping process may be performed for a time shorter than the epitaxial growth time of the semiconductor layer. Therefore, only a portion of the semiconductor layer is doped to form the second anti-punch-through region.

In one embodiment, when the plurality of second semiconductor fin structures 32 are used to form PMOS devices, the doping ions used in the in-situ doping process may include N-type dopants. For example, the N-type dopants may include phosphorus ions and/or arsenic ions. In one embodiment, the doping concentration in the in-situ doping process may be in a range of approximately $1.0 \times 10^{20}$ atom/cm$^3$ to $2.0 \times 10^{21}$ atom/cm$^3$. For example, the in-situ doping concentration may be $5.0 \times 10^{20}$ atom/cm$^3$.

In one embodiment, after forming the semiconductor layer 71 and the second anti-punch-through region 52 in the semiconductor layer 71, an annealing process may be performed on the semiconductor structure. As such, the damage to the crystal lattice of the semiconductor layer during the fabrication process may be repaired. Therefore, the annealing process may be conducive to epitaxial growth of the channel layer in a subsequent process, and may also be able to activate the dopants in the second anti-punch-through region and also in the first anti-punch-through region.

Figure 12:
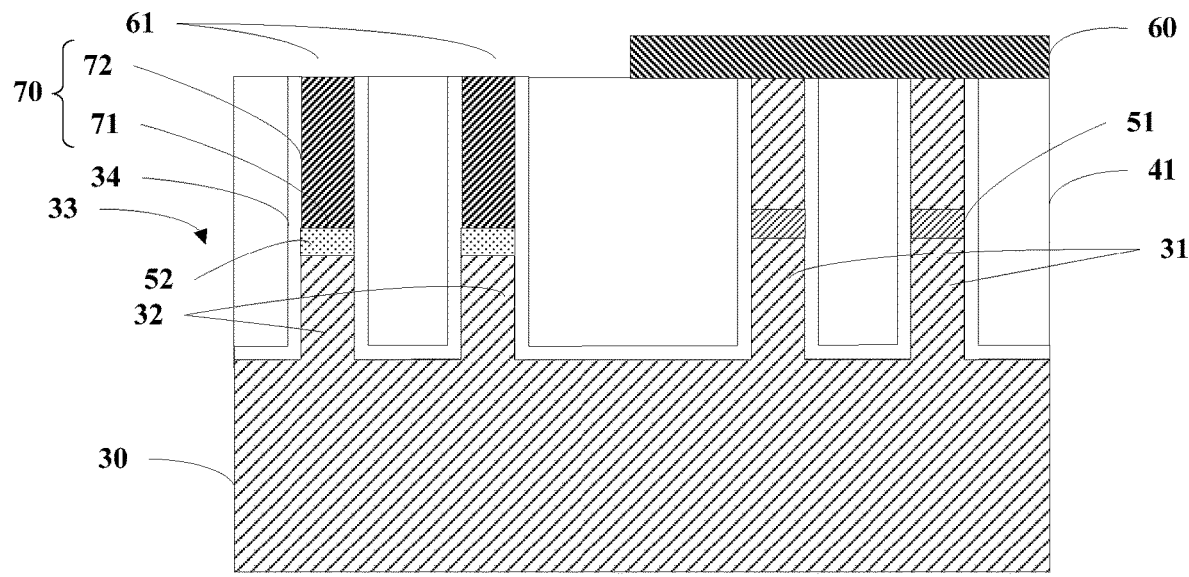

Further, an epitaxial channel layer may be formed on the semiconductor layer. FIG. 12 shows a schematic cross-section view of a corresponding semiconductor structure. Referring to FIG. 12, a channel layer 72 may be epitaxially grown on the semiconductor layer 71 in each trench 61. When the plurality of second semiconductor fin structures 32 are used to form PMOS devices, the channel layer 72 may be made of a material including SiGe.

Therefore, an epitaxial layer 70 containing a second anti-punch-through region 52 may be formed. The epitaxial layer 70 may include the semiconductor layer 71 and the channel layer 72, and the second anti-punch-through region 52 may be formed in the semiconductor layer 71.

In other embodiments, during the formation of the channel layer 72, the epitaxial channel layer 72 may be formed to exceed the top opening of the corresponding trench 61 (referring to FIG. 10). Accordingly, after forming the channel layer 72, the fabrication process may further include a planarization process performed on the channel layer. The planarization process may be a CMP process.

Figure 13:
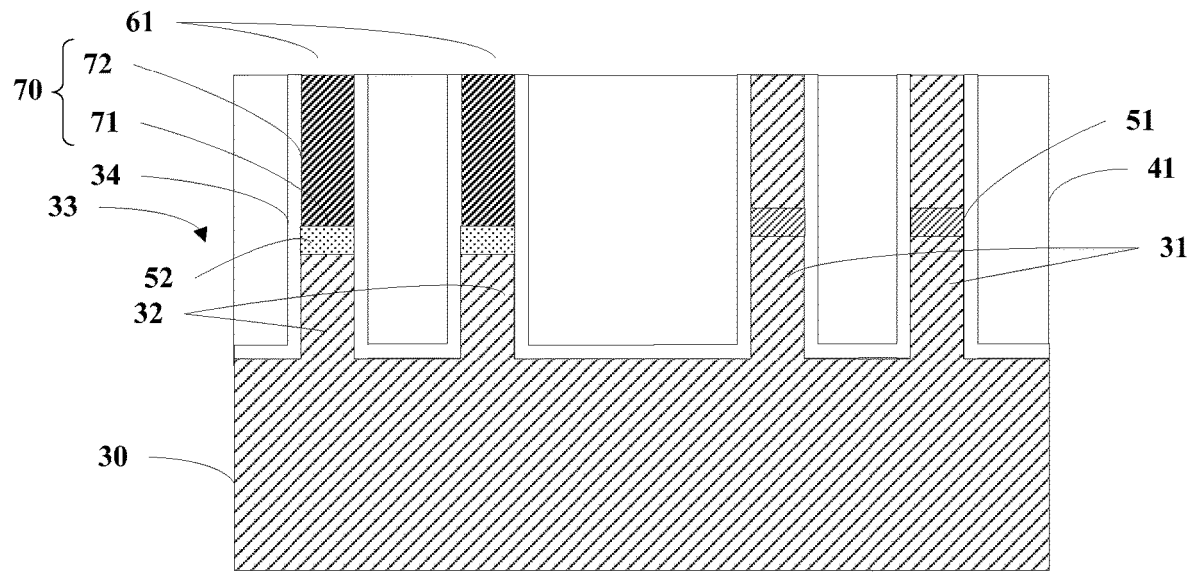

Further, referring to FIG. 13, the mask covering layer 60 may be removed.

Figure 14:
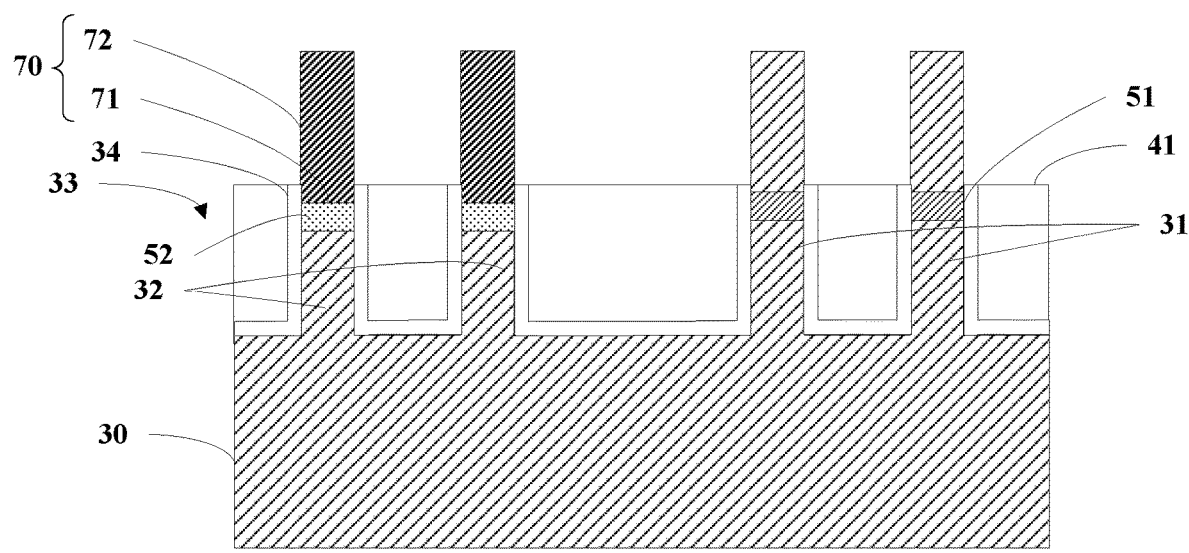

Moreover, referring to FIG. 14, after removing the mask covering layer 60 (referring to FIG. 12), an etching process may be performed on the trench insulation layer 41 to expose a portion of the first semiconductor fin structure 31 and a portion of the epitaxial layer 70. For example, a portion of the channel layer 72 may be exposed after performing the etching process.

As such, the present disclosure provides a method for fabricating semiconductor devices. According to the fabrication method, after forming a semiconductor structure, a first anti-punch-through doping process is performed on a plurality of first semiconductor fin structures in the semiconductor structure to form a first anti-punch-through region. During the fabrication process, the dopants introduced in the first anti-punch-through doping process may be able to diffuse into the second semiconductor fin structures and become doping ions in the second semiconductor fin structures. Therefore, a portion of the second semiconductor fin structures is removed to eliminate the dopants (e.g., P-type dopants such as boron ions, $BF_2$ ions, etc.) diffused into the second semiconductor fin structures. Further, an epitaxial layer containing a second anti-punch-through region is formed on the remaining portion of the second semiconductor fin structures. As such, the disclosed fabrication methods may be able to reduce the opportunity for the dopants introduced by the first anti-punch-through doping process to diffuse into the second semiconductor fin structures and thus become doping ions in the second semiconductor fin structures. For example, when the second semiconductor fin structures are used to form PMOS devices, the possibility of introducing P-type dopants into the second semiconductor fin structures may be reduced, and the performance of the formed device may thus be improved.

Further, during the process for forming the epitaxial layer, the semiconductor layer may be epitaxially formed on the remaining portion of the second semiconductor fin structure. A second anti-punch-through doping process may be performed on the formed semiconductor layer to form a second anti-punch-through region, or an in-situ doping process may be performed during the epitaxial growth of the semiconductor layer to form a second anti-punch-through region. Moreover, a channel layer may be epitaxially formed on the semiconductor layer. As such, the distance between the second anti-punch-through region and the channel layer may be controlled such that the mobility of carriers in the channel layer may not be affected by the second anti-punch-through region. Therefore, degradation of the performance of the device may be avoided.

Further, the present disclosure also provides a semiconductor device. FIG. 14 shows a schematic cross-section view of an exemplary semiconductor device consistent with various embodiments of the present disclosure.

Referring to FIG. 14, the semiconductor device may include a semiconductor substrate 30 and a plurality of semiconductor fin structures formed on the semiconductor substrate 30. The plurality of semiconductor fin structures may include a plurality of first semiconductor fin structures 31 and a plurality of second semiconductor fin structures 32. The plurality of first semiconductor fin structures 31 and the plurality of second semiconductor fin structures 32 may be separated from each other. The plurality of first semiconductor fin structures 31 may be used to form a plurality of first devices (e.g., NMOS devices) and the plurality of second semiconductor fin structures 32 may be used to form a plurality of second devices (e.g., PMOS devices). The top surface of the second semiconductor fin structures 32 may be lower than the top surface of the first semiconductor fin structures 31. A first anti-punch-through region 51 may be formed in each first semiconductor fin structure 31. In one embodiment, the depth of the first anti-punch-through region 51 in the first semiconductor fin structure 31 may be in a range of approximately 50 Å to 300 Å. For example, the depth may be 100 Å or 200 Å.

The semiconductor device may also include a plurality of trenches 33 surrounding each semiconductor fin structure, and a trench isolation layer 41 partially filled the plurality of trenches 33.

The semiconductor device may further include an epitaxial layer 70 formed on each second semiconductor fin structure 32. The epitaxial layer 70 may include a second anti-punch-through region 52. The height of the epitaxial layer 70 may be larger than the depth of the first anti-punch-through region 51 in the first semiconductor fin structures 31. In one embodiment, the height of the epitaxial layer 70 may be in a range of approximately 500 Å to 1000 Å. For example, the height of the epitaxial layer 70 may be 700 Å or 850 Å.

In one embodiment, the epitaxial layer 70 may include a semiconductor layer 71 formed on the second semiconductor fin structure 32 and a channel layer 72 formed on the semiconductor layer 71. Moreover, the second anti-punch-through region 52 may be formed in the semiconductor layer 71.

The semiconductor layer 71 and the second semiconductor fin structure 32 may be made of a same material including silicon. In one embodiment, the semiconductor layer 71 and the second semiconductor fin structure 32 may be made of silicon.

In one embodiment, the thickness of the semiconductor layer 71 may be in a range of approximately 50 Å to 200 Å.

In one embodiment, the channel layer 72 may be made of a material such as SiGe, SiC, a Group II-V compound, etc. As such, the mobility of the carriers in the channel layer may be improved.

Moreover, the semiconductor device may also include a liner insulation layer 34 formed on the semiconductor substrate 30 and/or the semiconductor fin structures. The trench insulation layer 41 may be formed on the liner insulation layer 34.

According to the disclosed semiconductor device, because the portion of the second semiconductor fin structures possibly doped in the first anti-punch-through doping process due to diffusion of the doping ions is removed during the fabrication process, the performance of the formed semiconductor device may be desired.

The present disclosure also provides another exemplary method for fabricating semiconductor devices. FIG. 15 shows a flowchart of an exemplary method for fabricating a semiconductor device consistent with various embodiments of the present disclosure. FIGS. 16-19 illustrate schematic cross-section views of semiconductor structures at certain stages of the exemplary fabrication process.

Referring to FIG. 15, in Step S1501, a semiconductor structure may be provided. The semiconductor structure may include a semiconductor substrate and a plurality of semiconductor fin structures formed on the semiconductor substrate. The plurality of semiconductor fin structures may include a plurality of first semiconductor fin structures and a plurality of second semiconductor fin structures. The plurality of first semiconductor fin structures and the plurality of second semiconductor fin structures may be separated from each other. The semiconductor structure may further include a plurality of trenches surrounding each semiconductor fin structure and a trench insulation layer filled into the plurality of trenches. Moreover, the top surface of the trench insulation layer may be leveled with the top surface of the plurality of semiconductor fin structures.

Step S1501 may be identical or similar to Step S201 shown in FIG. 2. The detailed illustration of providing the semiconductor structure may be referred to FIGS. 3-7 and the corresponding description in the above embodiments.

Returning to FIG. 15, in Step S1502, a first anti-punch-through doping process may be performed on the first semiconductor fin structures to form a first anti-punch-through region in the first semiconductor fin structures. In one embodiment, the doping depth of the first anti-punch-through doping process may be in a range of approximately 50 Å to 300 Å.

Further, returning to FIG. 15, in Step S1503, after performing the first anti-punch-through doping process, a portion of each second semiconductor fin structure may be removed to form a trench. In one embodiment, the depth of the formed trench may be larger than the doping depth of the first anti-punch-through doping process. For example, the depth of the trench may be in a range of approximately 500 Å to 1000 Å.

In one embodiment, Step S1503 may include the following steps. First, a mask covering layer may be formed on the semiconductor structure formed after performing the first anti-punch-through doping process. The mask covering layer may cover the plurality of first semiconductor fin structures and may expose the plurality of second semiconductor fin structures. Further, the trench may be formed by removing a portion of each second semiconductor fin structure through an etching process using the mask covering layer as an etch mask.

Step S1502 and Step S1503 may be identical or similar to Step S202 and Step S203 shown in FIG. 2, respectively. The detailed illustration of Step S1502 and S1503 may be referred to FIGS. 8-10 and the corresponding description in the above embodiments.

Figure 16:
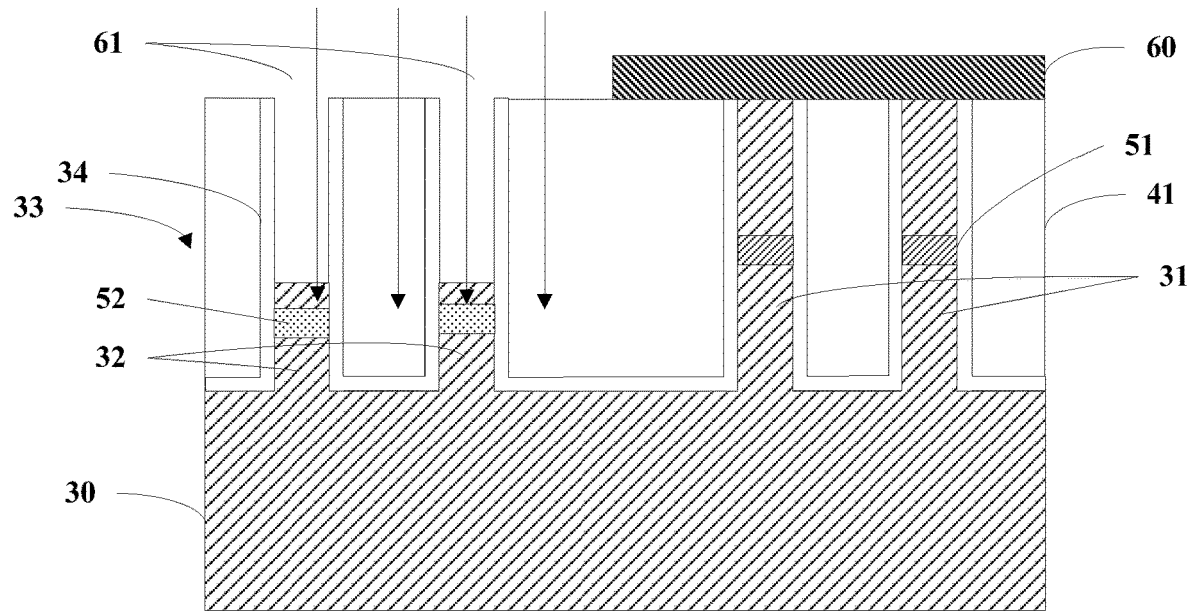
FIGS. 16-19 illustrate schematic cross-section views of semiconductor structures at certain stages of another exemplary method for fabricating a semiconductor device consistent with various embodiments of the present disclosure.

Further, referring to FIG. 15, in Step S1504, a second anti-punch-through doping process may be performed to form a second anti-punch-through region in each of the remaining portion of the second semiconductor fin structure. FIG. 16 illustrates a schematic cross-section view of a semiconductor structure obtained in Step S1504.

Referring to FIG. 16, after forming a trench 61 by removing a portion of each second semiconductor fin structure 32 through an etching process using a mask covering layer 60 as an etch mask, the mask covering layer 60 may not be removed. Further, a second anti-punch-through doping process may be performed using the mask covering layer as a mask to implant dopants into the remaining portion of each second semiconductor fin structure 32. As such, a second anti-punch-through region 52 may be formed in the remaining portion of each second semiconductor fin structure 32. In one embodiment, the second anti-punch-through doping process may be a second anti-punch-through implantation process.

Figure 17:
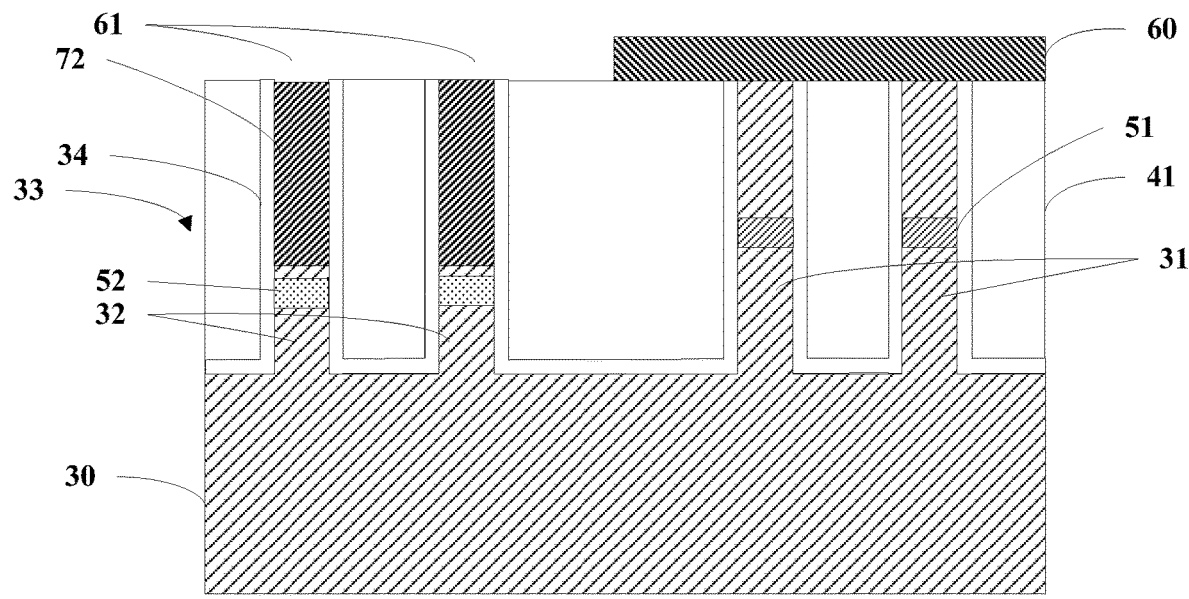

Further, returning to FIG. 15, in Step S1505, a channel layer may be epitaxially formed on the remaining portion of the second semiconductor fin structure in each trench. FIG. 17 illustrates a schematic cross-section view of a semiconductor structure obtained in Step S1505.

Referring to FIG. 17, a channel layer 72 may be epitaxially formed on the remaining portion of the second semiconductor fin structure 32 in each trench 61. The channel layer may be made of a material such as SiGe, SiC, a Group II-V compound, etc.

Figure 18:
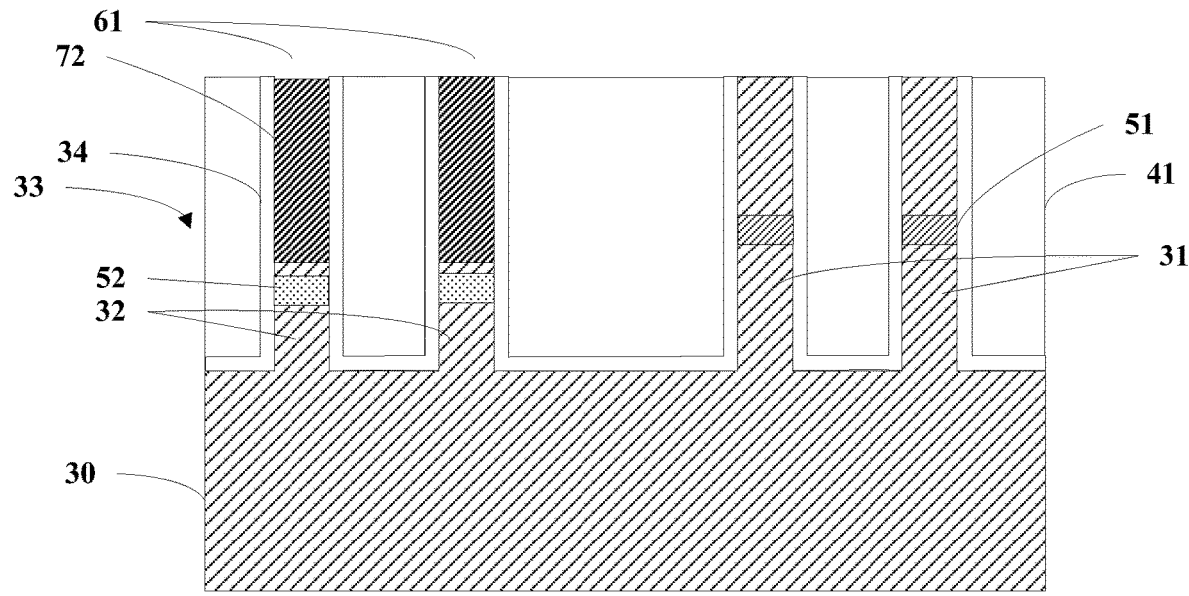

Further, referring to FIG. 18, after forming the channel layer 72 in each trench 61, the fabrication method may include removing the mask covering layer 60.

As such, the present disclosure provides another method for fabricating semiconductor devices. According to the fabrication method, after performing a first anti-punch-through doping process on a plurality of first semiconductor fin structures to form a first anti-punch-through region in each first semiconductor fin structure, a portion of each second semiconductor fin structure is removed to form a trench. Further, a second anti-punch-through region is formed in the remaining portion of each second semiconductor fin structure, and a channel layer is then epitaxially formed on the second semiconductor fin structure in each trench. As such, the disclosed fabrication methods may be able to reduce the opportunity for the dopants introduced by the first anti-punch-through doping process to diffuse into the second semiconductor fin structures and thus become doping ions in the second semiconductor fin structures. For example, when the second semiconductor fin structures are used to form PMOS devices, the possibility of introducing P-type dopants into the second semiconductor fin structures may be reduced, and the performance of the formed semiconductor device may thus be improved.

In one embodiment, after forming the second anti-punch-through region and prior to forming the channel layer, the fabrication process may also include performing an annealing process on the semiconductor structure with the second anti-punch-through region formed in the remaining portion of each second semiconductor fin structure. The annealing process may be able to repair the damage to the crystal lattice of the remaining portion of each second semiconductor fin structure during the second anti-punch-through doping process. As such, the annealing process may be conducive to epitaxial growth of the channel layer in a subsequent process, and may also be able to activate the dopants in the second anti-punch-through region and also in the first anti-punch-through region.

Figure 19:
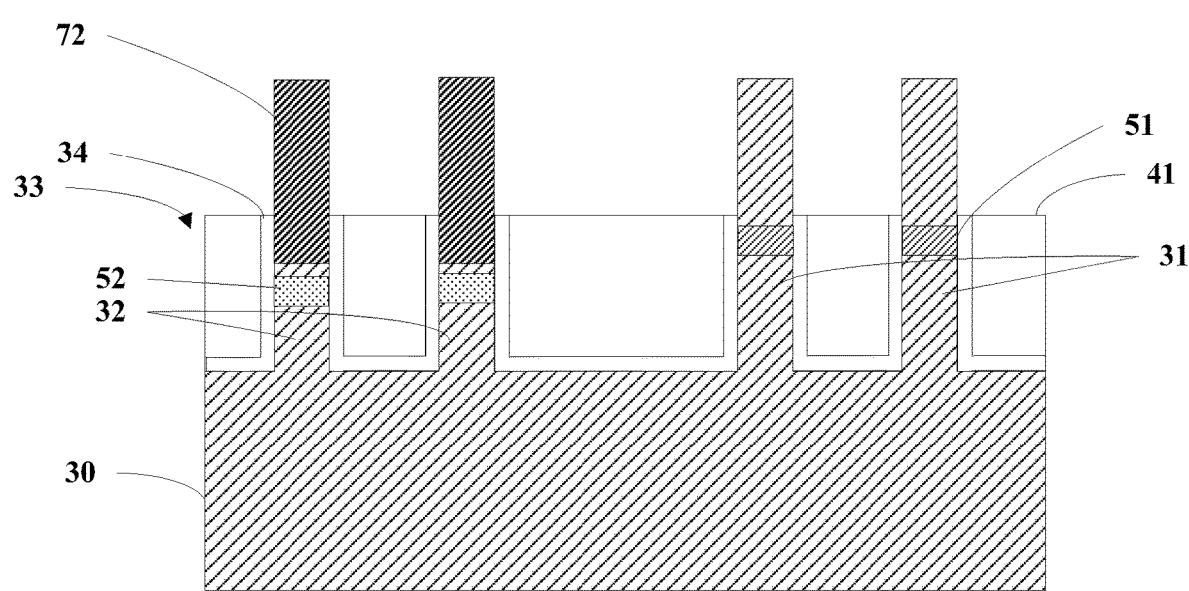

In one embodiment, referring to FIG. 19, the fabrication method may also include performing an etching process on the trench insulation layer 41 to expose a portion of the first semiconductor fin structure 31 and a portion of the channel layer 72.

Accordingly, the present disclosure provides a semiconductor device corresponding to the fabrication method described above. FIG. 19 shows a schematic cross-section view of an exemplary semiconductor device consistent with various embodiments of the present disclosure.

Referring to FIG. 19, the semiconductor device may include a semiconductor substrate 30 and a plurality of semiconductor fin structures formed on the semiconductor substrate 30. The plurality of semiconductor may include a plurality of first semiconductor fin structures 31 and a plurality of second semiconductor fin structures 32. The plurality of first semiconductor fin structures 31 and the plurality of second semiconductor fin structures 32 may be separated from each other. The plurality of first semiconductor fin structures 31 may be used to form a plurality of first devices (e.g., NMOS devices) and the plurality of second semiconductor fin structures 32 may be used to form a plurality of second devices (e.g., PMOS devices). The top surface of the second semiconductor fin structures 32 may be lower than the top surface of the first semiconductor fin structures 31. A first anti-punch-through region 51 may be formed in each first semiconductor fin structure 31, and a second anti-punch-through region 52 may be formed in each second semiconductor fin structure 32.

In one embodiment, referring to FIG. 19, the semiconductor device may also include a plurality of trenches 33 surrounding each semiconductor fin structure, and a trench isolation layer 41 partially filled the plurality of trenches 33. Further, the semiconductor device may include a channel layer 72 formed on each second semiconductor fin structure 32.

Further, the height of the channel layer 72 may be larger than the doping depth of the first anti-punch-through region 51 in each first semiconductor fin structure 31. In one embodiment, the height of the channel layer 72 may be in a range of approximately 500 Å to 1000 Å, and the doping depth of the first anti-punch-through region 51 may be in a range of approximately 50 Å to 300 Å.

According to the disclosed semiconductor device, because the portion of the second semiconductor fin structures possibly doped in the first anti-punch-through doping process due to diffusion of the doping ions is removed during the fabrication process, the performance of the formed semiconductor device may be desired.

Compared to existing semiconductor devices and fabrication methods, the disclosed semiconductor devices and fabrication methods may demonstrate advantages.

According to the disclosed semiconductor devices and fabrication methods, after performing a first anti-punch-through doping process to form a first anti-punch-through region in each first semiconductor fin structure, a portion of the second semiconductor fin structure is removed to form a trench. The depth of the trench may be larger than the doping depth of the first anti-punch-through doping process to ensure the complete removal of the portion of the second semiconductor fin structure that is possibly doped in the first anti-punch-through doping process due to diffusion of the dopants. Further, a second anti-punch-through region is formed in the remaining portion of each second semiconductor fin structure, and then an epitaxial channel layer may be formed on the remaining portion of the second semiconductor fin structure in each trench. Alternatively, after forming the trench by removing the portion of each second semiconductor fin structure, a semiconductor layer is formed on the remaining portion of the second semiconductor fin structure, and a second anti-punch-through region is formed in the semiconductor layer. The second anti-punch-through region can be formed in the semiconductor layer through an in-situ doping process or through a second anti-punch-through doping process performed after the formation of the semiconductor layer. Moreover, a channel layer may then be formed on the semiconductor layer containing the second anti-punch-through region.

Therefore, the disclosed fabrication methods may be able to reduce the opportunity for the dopants introduced by the first anti-punch-through doping process to diffuse into the second semiconductor fin structures and thus become doping ions in the second semiconductor fin structures. When the second semiconductor fin structures are used to form PMOS devices, the possibility of introducing P-type dopants into the second semiconductor fin structures may be reduced, and the performance of the formed device may thus be improved.

Moreover, according to the disclosed semiconductor devices, because the portion of the second semiconductor fin structures possibly doped in the first anti-punch-through doping process due to diffusion of the doping ions is removed during the fabrication process, the performance of the formed semiconductor device may be desired.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
    providing a semiconductor structure including a semiconductor substrate, a plurality of semiconductor fin structures formed on the semiconductor substrate, a liner insulation layer formed on the semiconductor substrate and sidewalls of each semiconductor fin structure of the plurality of the semiconductor fin structures, and a trench insulation layer formed on the semiconductor substrate and surrounding each semiconductor fin structure of the plurality of the semiconductor fin structures, wherein the plurality of semiconductor fin structures include a plurality of first semiconductor fin structures and a plurality of second semiconductor fin structures, the trench insulation layer is formed on the liner insulation layer, and a top surface of the trench insulation layer is leveled with a top surface of the semiconductor fin structures;
    performing a first anti-punch-through doping process on the plurality of first semiconductor fin structures to form a first anti-punch-through region in each first semiconductor fin structure;
    removing a portion of each second semiconductor fin structure to form a trench to expose sidewalls of a top portion of the liner insulation layer;
    forming a semiconductor layer on the remaining portion of each second semiconductor fin structure and on the sidewalls of the top portion of the liner insulation layer;
    forming a second anti-punch-through region by performing a second anti-punch-through doping process on the semiconductor layer to convert the semiconductor layer to the second anti-punch-through doping region;
    performing an annealing process on the second anti-punch-through region;
    after performing the annealing process, forming a channel layer on the second anti-punch-through region and on the sidewalk of the top portion of the liner insulation layer; and
    performing an etching process on the trench insulation layer and the liner insulation layer to expose a portion of the plurality of first semiconductor fin structures over the first anti-punch-through region and a portion of the channel layer, a remaining portion of the plurality of first semiconductor fin structures over the first anti-punch-through region and a remaining portion of the channel layer being left covered by a remaining portion of the trench insulation layer and liner insulation layer.

2. The method for fabricating the semiconductor device according to claim 1, wherein:
    a depth of the trench formed by removing the portion of the second semiconductor fin structure is larger than a doping depth of the first anti-punch-through doping process.

3. The method for fabricating the semiconductor device according to claim 2, wherein:
    the depth of the trench is in a range of 500 Å to 1000 Å; and
    the doping depth of the first anti-punch-through doping process in a range of 50 Å to 300 Å.

4. The method for fabricating the semiconductor device according to claim 1, wherein:
    the semiconductor layer and the channel layer form an epitaxial layer; and
    a duration of an epitaxial growth of the epitaxial layer is greater than a duration of the second anti-punch-through doping process.

5. The method for fabricating the semiconductor device according to claim 4, wherein:
    the semiconductor layer and the plurality of the second semiconductor fin structures are made of a same material.

6. The method for fabricating the semiconductor device according to claim 4, wherein:
    the semiconductor layer is made of a material including silicon;

a thickness of the semiconductor layer is in a range of 50 Å to 200 Å; and the channel layer is made of one of SiGe, SiC, and a Group III-V compound.

7. The method for fabricating the semiconductor device according to claim 1, wherein:

the first anti-punch-through doping process is a first anti-punch-through implantation process;

when the plurality of the first semiconductor fin structures are used to form N-type metal-oxide-semiconductor (NMOS) devices, dopants used to form the first anti-punch-through region include boron ions or $BF_2$ ions; and when the plurality of the first semiconductor fin structures are used to form P-type metal-oxide-semiconductor (PMOS) devices, dopants used to form the first anti-punch-through region include phosphorus ions or arsenic ions.

8. The method for fabricating the semiconductor device according to claim 1, wherein:

when the plurality of the second semiconductor fin structures are used to form PMOS devices, dopants used to form the second anti-punch-through region include phosphorus ions or arsenic ions; and when the plurality of the second semiconductor fin structures are used to form NMOS devices, dopants used to form the second anti-punch-through region include boron ions or $BF_2$ ions.

9. The method for fabricating the semiconductor device according to claim 1, wherein forming the trench by removing the portion of each second semiconductor fin structure includes:

forming a mask covering layer on the semiconductor structure obtained after performing the first anti-punch-through doping process, wherein the mask covering layer covers the plurality of first semiconductor fin structures and exposes the plurality of second semiconductor fin structures;

forming the trench by removing the portion of the second semiconductor fin structure through an etching process performed on the second semiconductor fin structure using the mask covering layer as an etch mask.

10. The method for fabricating the semiconductor device according to claim 4, wherein:

forming the epitaxial layer and forming the second anti-punch-through region are performed simultaneously.

* * * * *